(12) United States Patent
Han

(10) Patent No.: US 10,465,901 B1
(45) Date of Patent: Nov. 5, 2019

(54) LIGHT-EMITTING CHASSIS STRUCTURE

(71) Applicant: Tai-Sheng Han, New Taipei (TW)

(72) Inventor: Tai-Sheng Han, New Taipei (TW)

(73) Assignee: EVGA CORPORATION, New Taipei (TW)

( * ) Notice: Subject to any disclaimer, the term of this patent is extended or adjusted under 35 U.S.C. 154(b) by 0 days.

(21) Appl. No.: 16/179,194

(22) Filed: Nov. 2, 2018

(51) Int. Cl.
*F21V 33/00* (2006.01)
*H05K 7/04* (2006.01)
*H05K 7/14* (2006.01)
*F21W 131/403* (2006.01)
*H05K 5/02* (2006.01)

(52) U.S. Cl.
CPC ........... *F21V 33/0052* (2013.01); *H05K 7/04* (2013.01); *H05K 7/1422* (2013.01); *F21W 2131/403* (2013.01); *H05K 5/0243* (2013.01); *H05K 5/0247* (2013.01)

(58) Field of Classification Search
CPC .... F21V 33/0052; H05K 7/1422; H05K 7/04; H05K 5/0247; H05K 5/0243; F21W 2131/403
See application file for complete search history.

(56) References Cited

U.S. PATENT DOCUMENTS

| | | | | |
|---|---|---|---|---|
| 7,517,111 B2* | 4/2009 | Tsai | ....................... | G06F 1/182 362/249.01 |
| 9,820,366 B2* | 11/2017 | Kuo | ........................ | G06F 3/06 |
| 9,976,737 B2* | 5/2018 | Cheng | ................ | F21V 33/0052 |
| 2013/0169166 A1* | 7/2013 | Zhang | ................ | H05B 37/0272 315/154 |
| 2016/0044217 A1* | 2/2016 | Richardson | .......... | H04N 5/2256 348/207.11 |

* cited by examiner

*Primary Examiner* — Peggy A Neils
(74) *Attorney, Agent, or Firm* — Che-Yang Chen; Law Offices of Scott Warmuth

(57) ABSTRACT

A light-emitting chassis structure comprising a plate, a plurality of transparent shafts, and at least one side plate, the plate has a plurality of plate conductive portions for assembling with conductive assembling portions of the transparent shafts respectively, inside the transparent shaft is disposed with at least one light-emitting member, and the side plate and the plate are assembled with the light-emitting shafts disposing in between. Thereby, a light source generated by the electrically conducted light-emitting member can be guided by the transparent shaft, so that the light-emitting chassis structure can generate the light source to enhance the overall visual effects. The light-emitting chassis structure is formed with the side plate and the plate, and computer accessories can be disposed at positions of two side surfaces of the plate according to requirements, which are not limited by the metal casing to achieve the effect of adjusting the configuration space conveniently.

7 Claims, 6 Drawing Sheets

LIGHT-EMITTING CHASSIS STRUCTURE

BACKGROUND OF THE INVENTION

Field of Invention

This present invention relates to a computer chassis, and more particularly to a light-emitting chassis structure that can enhance visual effects and can easily adjust the configuration space.

Related Art

The computer chassis of a general desktop computer is mostly in an upright rectangular shape, and the computer chassis mainly comprises a main frame and a plurality of shell plates for correspondingly covering the sides of the main frame. Computer accessories such as motherboard, hard disk and power supply unit are installed inside the computer chassis, also installed with a heat sink to provide heat dissipation. However, most of the current computer chassis are delivered after installation by the system manufacturer, and the computer chassis of general desktop computers has a metal frame, a metal casing and a front panel, and the front panel is usually made of plastic. Some chassis are all aluminum with the metal frame, the metal casing and the front panel made of aluminum alloy. However, these chassis have less variation in shape and usually have no refreshing design in appearance, so in order to adjust to the current market demand and requirement, how to add visual effects and additional functions on the appearance of computer chassis to attract consumers' favor is one of the important issues at present.

SUMMARY OF THE INVENTION

Therefore, in order to effectively solve the above problems, a main object of the present invention is to provide a light-emitting chassis structure that can enhance visual effects and can easily adjust the configuration space.

In order to achieve the above object, the present invention provides a light-emitting chassis structure, comprising: a plate, a plurality of transparent shafts and at least one side plate, wherein the plate is penetratingly disposed with a plurality of plate conductive portions, the transparent shafts are disposed at positions of the plate conductive portions, an end of the transparent shaft corresponding to the position of the plate conductive portion is formed with a conductive assembling portion, and the conductive assembling portion and the plate conductive portion are assembled with each other; inside the transparent shaft is disposed with at least one light-emitting member, the side plate is disposed at a position by one side surface of the plate, and the side plate and the plate are assembled with the light-emitting shafts disposing in between, the side plate is penetratingly disposed with a plurality of side plate holes, and another end of the transparent shaft opposite to the end of the conductive assembling portion is assembled with the side plate hole. Thereby, a light source generated by the electrically conducted light-emitting member can be guided by the transparent shaft, so that the light-emitting chassis structure can generate the light source to enhance the overall visual effects. The light-emitting chassis structure is formed with the side plate and the plate, and computer accessories can be disposed at positions of two side surfaces of the plate according to requirements, which are not limited by the metal casing to achieve the effect of adjusting the configuration space conveniently.

DETAILED DESCRIPTION OF THE INVENTION

The foregoing and other technical contents, features and effects of the present invention will be clearly presented in the following detailed description of the preferred embodiments with reference to the drawings.

Figure 1:
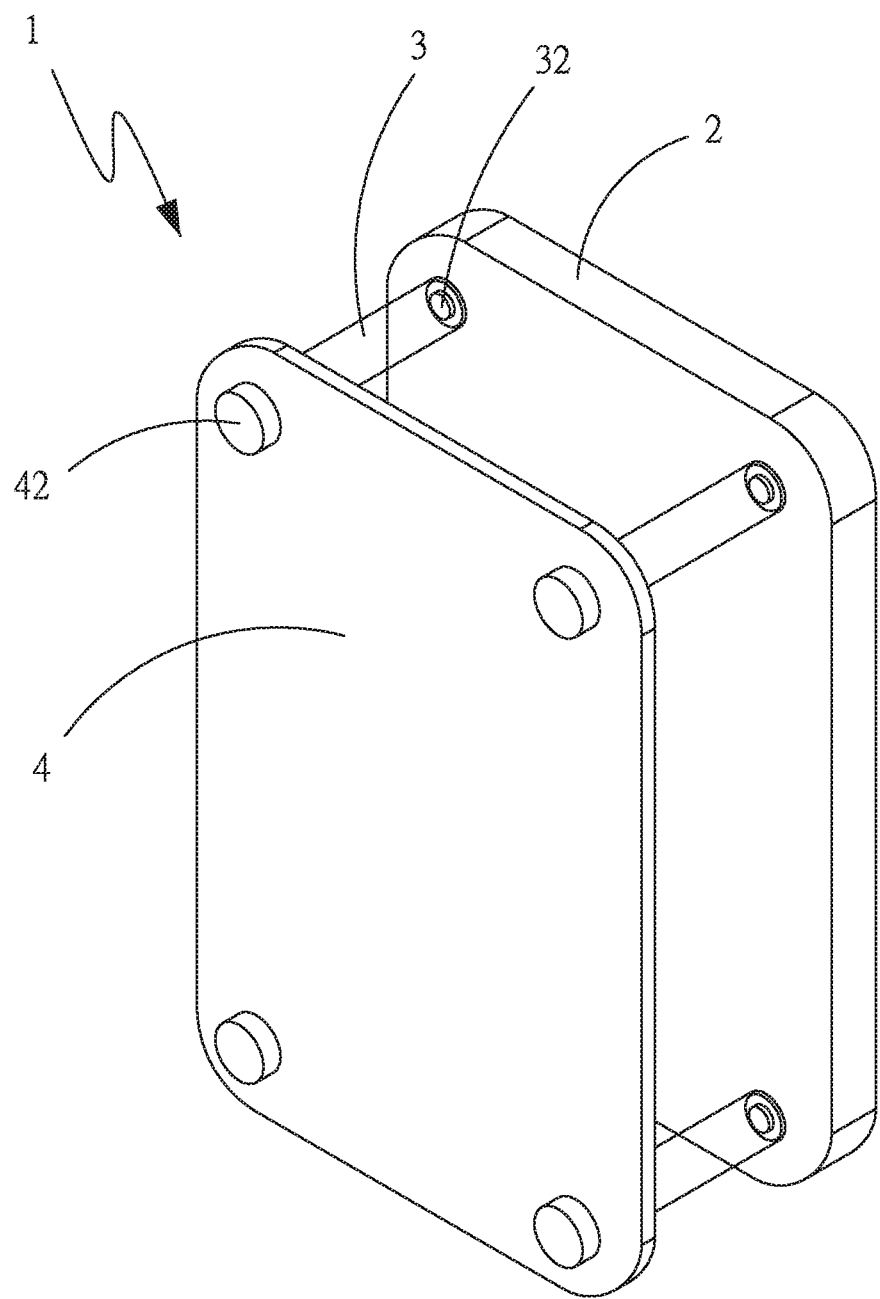
FIG. 1 is a perspective assembled view of the present invention.
Figure 2:
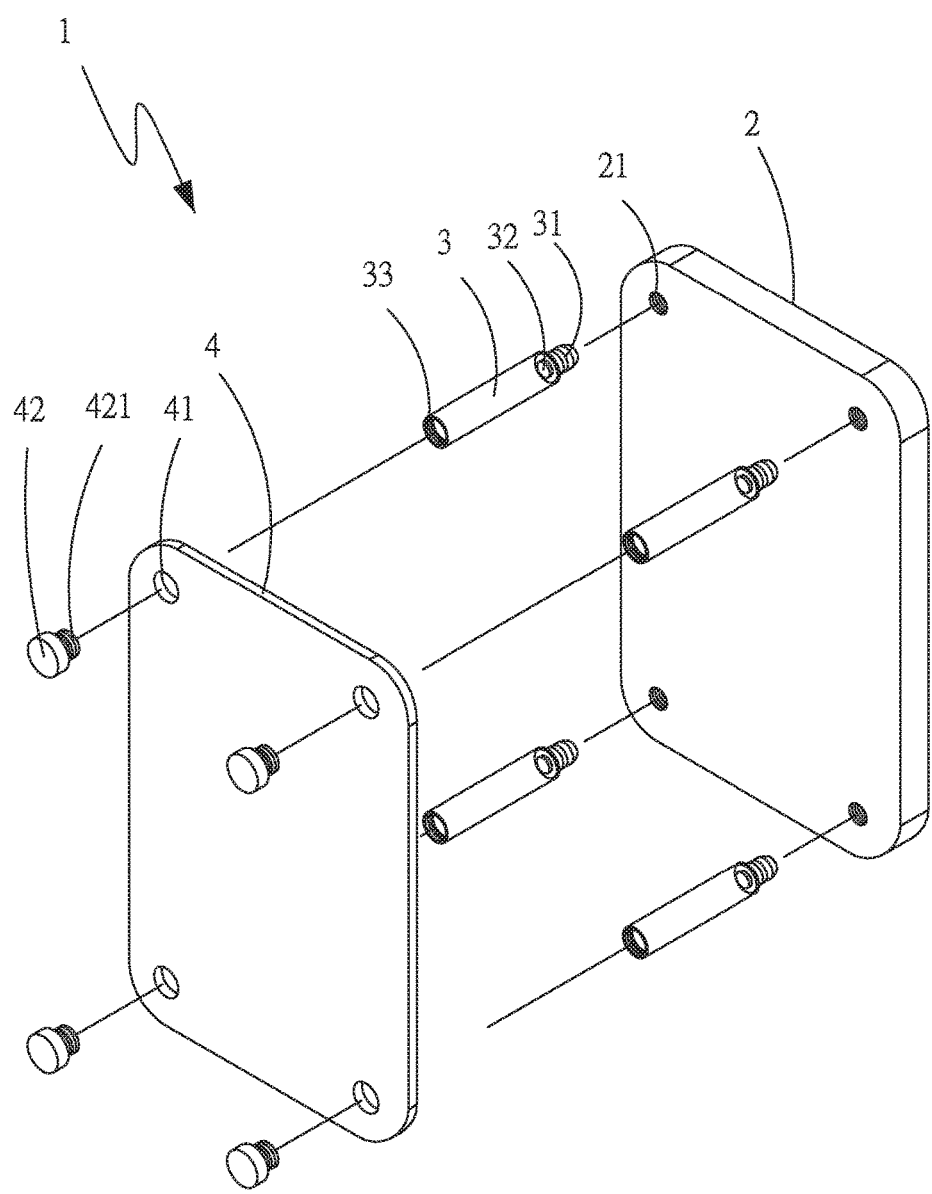
FIG. 2 is a perspective exploded view of the present invention.
Figure 3:
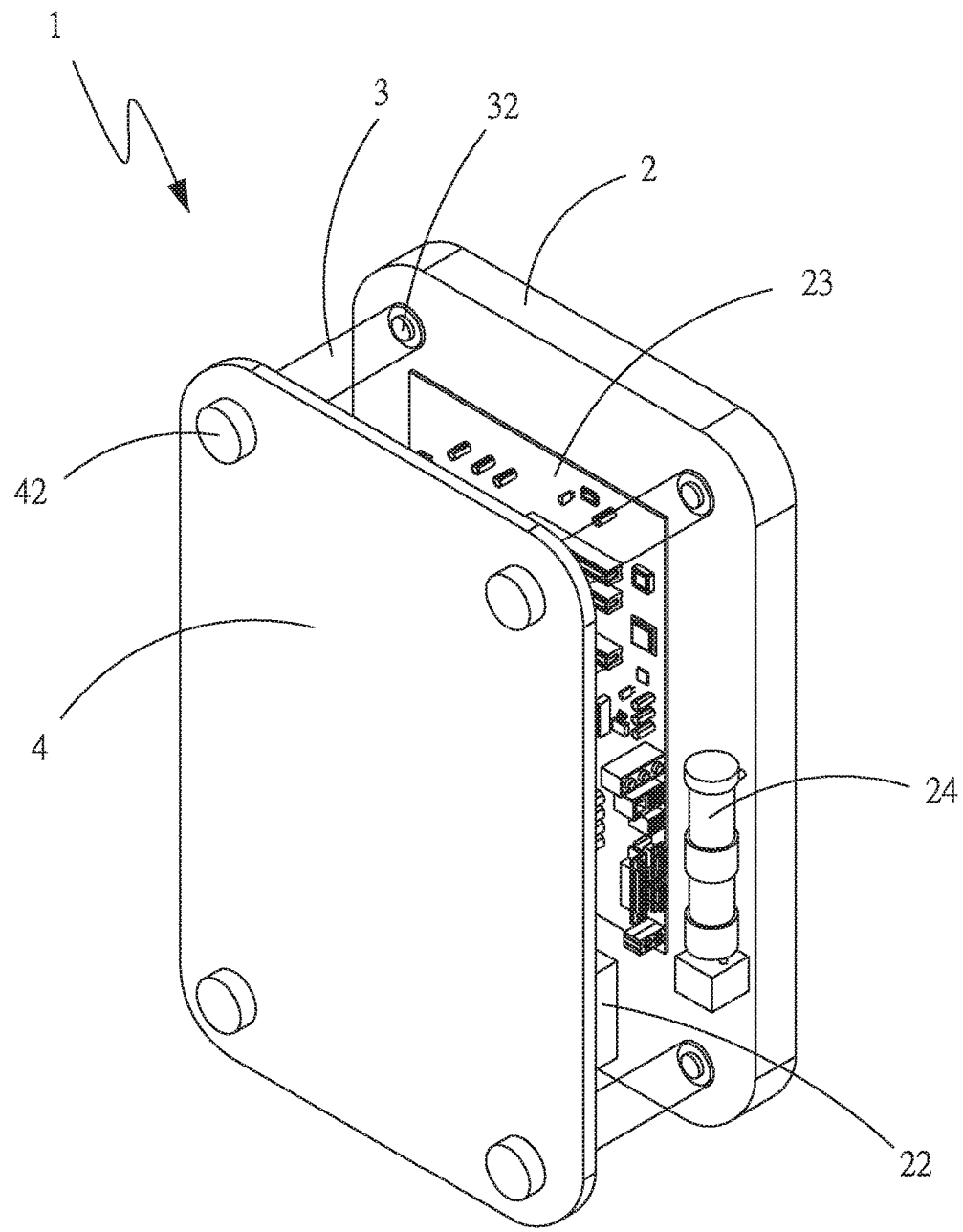
FIG. 3 is a first schematic diagram of the implementation of the present invention.
Figure 4:
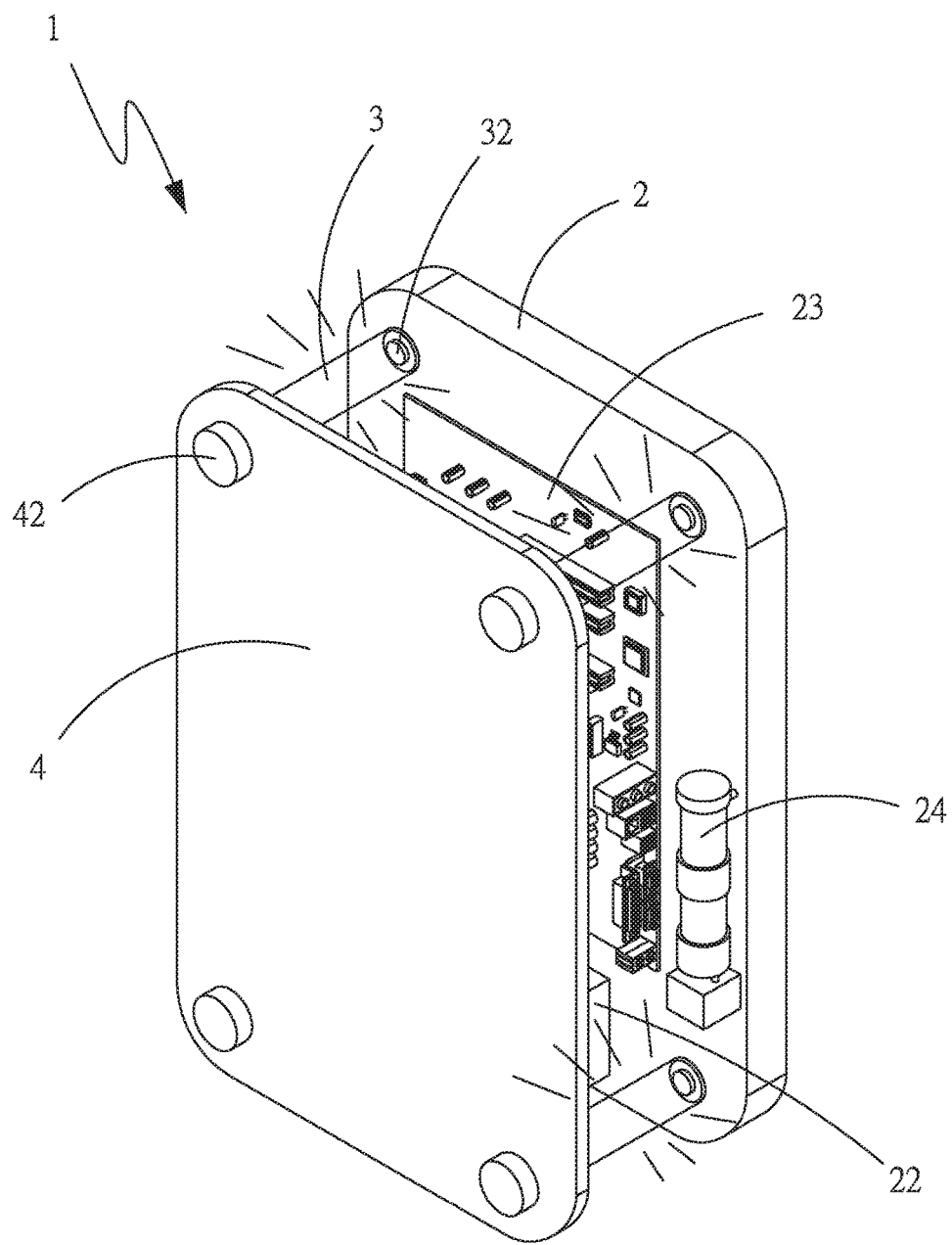
FIG. 4 is a second schematic diagram of the implementation of the present invention.
Figure 5:
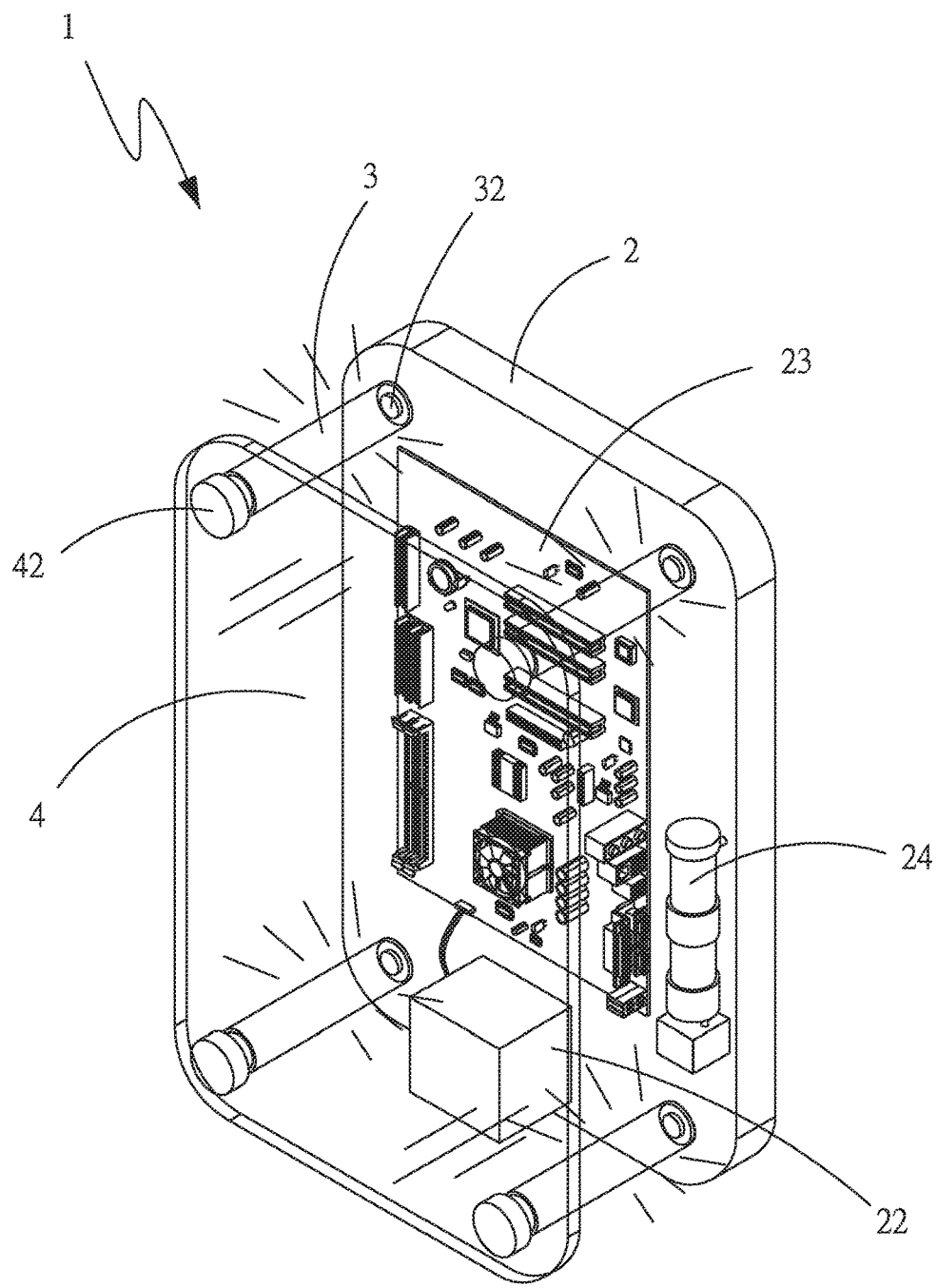
FIG. 5 is a third schematic diagram of the implementation of the present invention.
Figure 6:
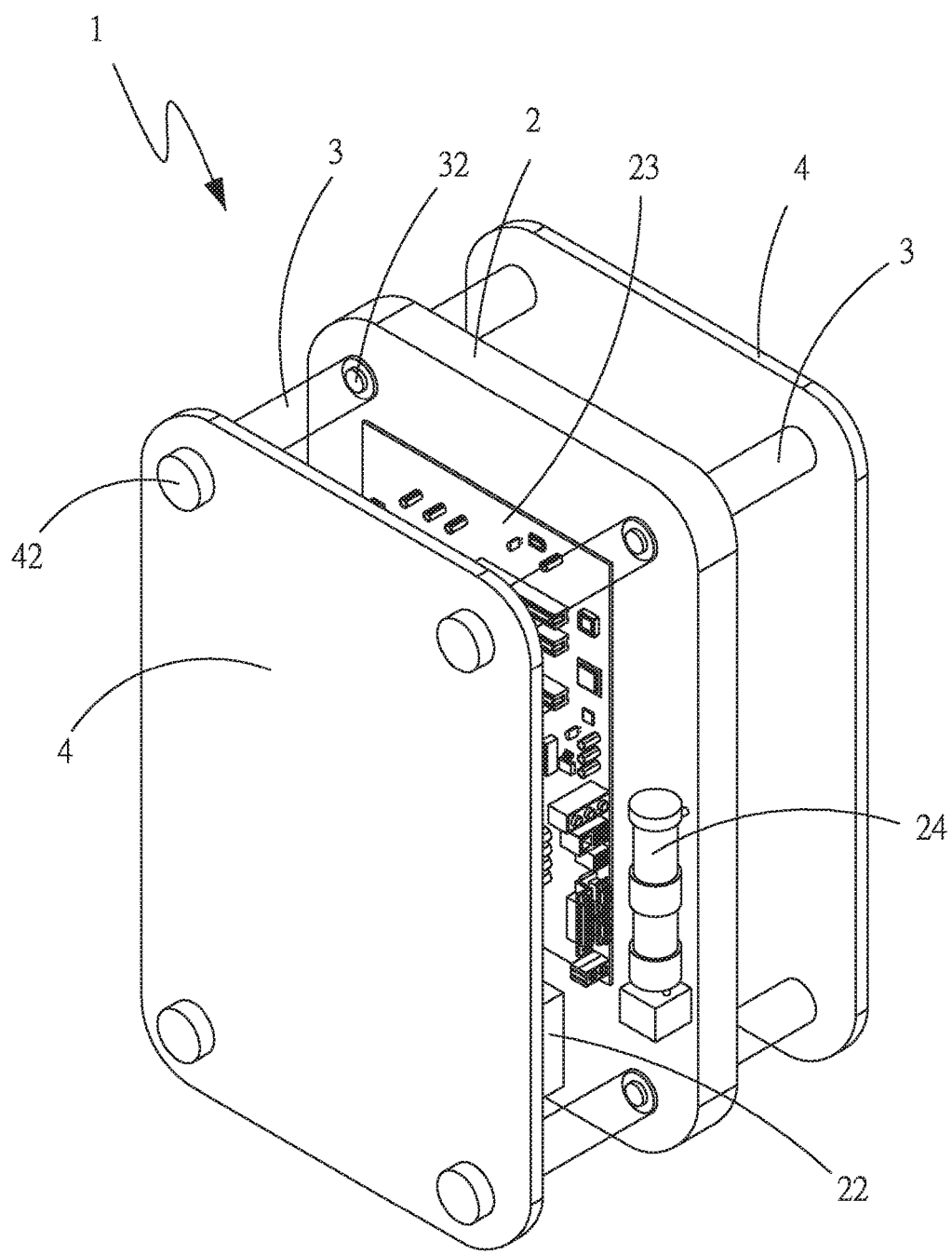
FIG. 6 is a fourth schematic diagram of the implementation of the present invention.

Please refer to FIG. 1 and FIG. 2, which are respectively perspective assembled and perspective exploded views of the present invention. A light-emitting chassis structure 1 comprises a plate 2, a plurality of transparent shafts 3, and at least one side plate 4, wherein the plate 2 is penetratingly formed with a plurality of plate conductive portions 21. In this embodiment, the plate conductive portions 21 are formed at four corners of the plate 2, the plate conductive portion is a screw hole, and the screw hole can conduct electric power. But a number of the plate conductive portions 21 is not limited thereto, and the plate conductive portion 21 is not limited to a screw hole. The plate conductive portion 21 can be conductive spring, conductive tab, conductive clip or other conductive structures.

The transparent shafts 3 are respectively disposed on the plate conductive portions 21, each of the transparent shafts 3 is formed by acryl, and one end of each of the transparent shafts 3 is formed with a conductive assembling portion 31. The conductive assembling portion 31 is assembled with the plate conductive portion 21. A light-emitting member 32 is disposed inside each of the transparent shafts 3, and the light-emitting member 32 is electrically connected to the conductive assembling portion 31. In this embodiment, the conductive assembling portion 31 is a conductive screw, but is not limited thereto. The conductive assembling portion 31 can be conductive spring, conductive tab, conductive clip or other conductive structures.

The side plate 4 is penetratingly formed with a plurality of side plate holes 41, and another end of the transparent shaft 3 opposite to the end of the conductive assembling portion 31 is assembled with the side plate hole 41. The side plate 4 is disposed with at least one quick release element 42 at a position of the side plate hole 41, and the quick release element 42 passes through the side plate hole 41 and assembles with the transparent shaft 3 to fix the transparent shaft 3 and the side plate 4 with each other. In this embodiment, a connecting portion 33 is formed inside the end of the transparent shaft 3 opposite to the end of the conductive assembling portion 31, the quick release element 42 is formed with an assembling portion 421, and the assembling portion 421 passes through the side plate hole 41 and assembles with the connecting portion 33 to fix the transparent shaft 3 and the side plate 4 with each other, but the quick release element 42 is not limited thereto, any element can be the quick release element 42 as long as the element can quickly disassemble the transparent shaft 3 and the side plate 4.

Please refer to the foregoing drawings as well as FIG. 3 to FIG. 6, which are respectively first to fourth schematic diagrams of the implementation of the present invention. The plate 2 of the light-emitting chassis structure 1 is disposed with at least one power supply unit 22, a motherboard 23 and at least one computer accessory 24, wherein the computer accessory 24 can be a fan or a hard disk or a water cooling device, etc. In this embodiment, the power supply unit 22 supplies power to the plate conductive portions 21, but is not limited thereto. The plate conductive portions 21 can be electrically powered by an external power source, and the conductive assembling portions 31 of the transparent shafts 3 are electrically connected to the plate conductive portions 21, so that when the light-emitting chassis structure 1 is activated, the power supply unit 22 supplies power for the plate 2, the motherboard 23 and the computer accessory 24. In addition to the power of the power supply unit 22 being supplied to the motherboard 23 and the computer accessory 24, the power of the power supply unit 22 can be further conducted to the conductive assembling portions 31 via the plate conductive portions 21. The conductive assembling portions 31 receive the power and activate the light-emitting members 32, and a light source generated by the electrically conducted light-emitting member 32 can be guided by the transparent shaft 3, so that the light-emitting chassis structure 1 can generate the light source to enhance the overall visual effects. The light-emitting chassis structure 1 is formed with the side plate 4 and the plate 2, and the computer accessories 24 can be disposed at positions of two side surfaces of the plate 2 according to requirements, which are not limited by the metal casing to achieve the effect of adjusting the configuration space conveniently. Wherein inside the plate 2 can be formed with an accommodation space for accommodating various types of computer accessories 24, but in this embodiment, the plate 2 is used as an implementation, and the computer accessories 24 are disposed on the plate 2.

Wherein the side plate 4 disposed by one of the side surfaces of the plate 2 can be disposed as a transparent plate, and after the light source generated by the electrically conducted light-emitting member 32 is guided by the transparent shaft 3, it is further transmitted to the side plate 4, so that both the side plate 4 and the transparent shafts 3 can generate the light source to enhance the overall visual effects of the light-emitting chassis structure 1. Furthermore, the motherboard 23, the computer accessory 24 and the power supply unit 22 can be disposed on one of the side surfaces or both of the side surfaces of the plate 2 as required, and the plate 2 can also be formed with the plate conductive portions 21 on the other side surface. The transparent shafts 3 can be disposed on the plate conductive portions 21, and the other ends of the transparent shafts 3 are disposed with the side plate 4. Thereby, a light source generated by the electrically conducted light-emitting members 32 on the two side surfaces of the plate 2 can be guided by the transparent shafts 3, so that the light-emitting chassis structure 1 can generate the light source to enhance the overall visual effects, and the computer accessories 24 can be disposed at positions of the two side surfaces of the plate 2 according to requirements, which are not limited by the metal casing to achieve the effect of adjusting the configuration space conveniently.

It is to be understood that the above description is only preferred embodiments of the present invention and is not used to limit the present invention, and changes in accordance with the concepts of the present invention may be made without departing from the spirit of the present invention, for example, the equivalent effects produced by various transformations, variations, modifications and applications made to the configurations or arrangements shall still fall within the scope covered by the appended claims of the present invention.

What is claimed is:

1. A light-emitting chassis structure, comprising:
   a plate, the plate being formed with a plurality of plate conductive portions;
   a plurality of transparent shafts, an end of each of the transparent shafts being formed with a conductive assembling portion, the conductive assembling portion being assembled with the plate conductive portion, and inside each of the transparent shafts being disposed with at least one light-emitting member; and
   at least one side plate, the side plate being formed with a plurality of side plate holes, and each of the side plate holes being assembled with another end of the transparent shaft respectively;
   wherein the side plate is formed with the side plate holes, the side plate is disposed with at least one quick release element at a position of the side plate hole, and the quick release element passes through the side plate hole and assembles with the transparent shaft to fix the transparent shaft and the side plate with each other.

2. The light-emitting chassis structure as claimed in claim 1, wherein the plate is disposed with at least one power supply unit thereon, the power supply unit supplies power for the plate conductive portions, the conductive assembling portions are electrically connected to the plate conductive portions, and the plate conductive portions conduct power to the conductive assembling portions.

3. The light-emitting chassis structure as claimed in claim 1, wherein a connecting portion is formed inside the end of the transparent shaft opposite to the end of the conductive assembling portion, the quick release element is formed with an assembling portion, and the assembling portion passes through the side plate hole and assembles with the connecting portion to fix the transparent shaft and the side plate with each other.

4. The light-emitting chassis structure as claimed in claim 1, wherein the side plate is a transparent plate.

5. The light-emitting chassis structure as claimed in claim 1, wherein the plate is disposed with a motherboard thereon.

6. The light-emitting chassis structure as claimed in claim 1, wherein the plate is disposed with at least one computer accessory thereon.

7. The light-emitting chassis structure as claimed in claim 1, wherein the plate conductive portion is a screw hole, the conductive assembling portion is a screw locking element, and the conductive assembling portion is assembled in the plate conductive portion and is electrically conducted by the plate conductive portion.

* * * * *